US012593729B2

(12) United States Patent (10) Patent No.: US 12,593,729 B2
Schmenger et al. (45) Date of Patent: Mar. 31, 2026

(54) POWER MODULE HAVING AT LEAST THREE POWER UNITS

(71) Applicant: Siemens Aktiengesellschaft, Munich (DE)

(72) Inventors: Jens Schmenger, Forchheim (DE); Roman Kögler, Nuremberg (DE); Alexander Luft, Nuremberg (DE); Lutz Namyslo, Hausen (DE); Bernd Roppelt, Unterhaid (DE); Thomas Schwinn, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 426 days.

(21) Appl. No.: 18/013,474

(22) PCT Filed: May 4, 2021

(86) PCT No.: PCT/EP2021/061669
§ 371 (c)(1),
(2) Date: Dec. 28, 2022

(87) PCT Pub. No.: WO2022/002464
PCT Pub. Date: Jan. 6, 2022

(65) Prior Publication Data
US 2023/0238374 A1 Jul. 27, 2023

(30) Foreign Application Priority Data
Jun. 30, 2020 (EP) ..................................... 20183215

(51) Int. Cl.
*H10W 90/00* (2026.01)
*H05K 7/20* (2006.01)
(Continued)

(52) U.S. Cl.
CPC ........ *H10W 90/00* (2026.01); *H05K 7/20918* (2013.01); *H10W 70/611* (2026.01);
(Continued)

(58) Field of Classification Search
CPC .............. H01L 25/18; H01L 23/49811; H01L 23/5385; H01L 24/32; H01L 24/48;
(Continued)

(56) References Cited

U.S. PATENT DOCUMENTS 9,275,926 B2 3/2016 Hable et al.
2005/0006054 A1 1/2005 Miyazaki et al.
(Continued)

FOREIGN PATENT DOCUMENTS

CN 107004914 A 8/2017
DE 102009001722 A1 9/2010
(Continued)

OTHER PUBLICATIONS

PCT International Search Report and Written Opinion of International Searching Authority mailed Jul. 28, 2021 corresponding to PCT International Application No. PCT/EP2021/061669 filed Apr. 5, 2021.

*Primary Examiner* — Elias Ullah
(74) *Attorney, Agent, or Firm* — Henry M. Feiereisen LLC

(57) ABSTRACT

A power module includes at least two power units. Each power unit includes at least one power semiconductor and a substrate. In order to reduce the installation space required for the power module and to improve cooling, the at least one power semiconductor is connected, in particular in a materially bonded manner, to the substrate. The substrates of the at least two power units are each directly connected in a
(Continued)

materially bonded manner to a surface of a common heat sink. A power converter having at least one power module is also disclosed.

19 Claims, 7 Drawing Sheets

(51) Int. Cl.

| | |
|---|---|
| *H10W 70/60* | (2026.01) |
| *H10W 40/25* | (2026.01) |
| *H10W 72/00* | (2026.01) |
| *H10W 72/90* | (2026.01) |

(52) U.S. Cl.

CPC ....... *H10W 90/401* (2026.01); *H10W 90/701* (2026.01); *H10W 40/255* (2026.01); *H10W 72/884* (2026.01); *H10W 72/944* (2026.01); *H10W 90/734* (2026.01); *H10W 90/754* (2026.01)

(58) Field of Classification Search

CPC ..... H01L 24/73; H01L 23/3735; H01L 24/06; H01L 25/072; H01L 2224/06181; H01L 2224/32227; H01L 2224/48091; H01L 2224/48227; H01L 2224/73265; H01L 24/29; H01L 24/40; H01L 25/115; H01L 2224/29111; H01L 2224/2919; H01L 2224/40227; H01L 2224/45014; H01L 2224/45015; H01L 2224/45099; H01L 2224/8384; H01L 2924/00014; H01L 2924/1203; H01L 2924/1304; H01L 2924/19107; H01L 21/4882; H01L 23/467; H05K 7/20918

See application file for complete search history.

(56) References Cited

U.S. PATENT DOCUMENTS

| | | | |
|---|---|---|---|
| 2009/0197439 A1 | 8/2009 | Nabilek et al. | |
| 2011/0059580 A1* | 3/2011 | Jeon ....................... | H01L 24/73 |
| | | | 438/122 |
| 2011/0299253 A1 | 12/2011 | Nabilek | |
| 2012/0175755 A1 | 7/2012 | Bayerer | |
| 2018/0025963 A1 | 1/2018 | Miller | |
| 2019/0043781 A1 | 2/2019 | Degrenne | |
| 2019/0348342 A1 | 11/2019 | Prajuckamol et al. | |
| 2020/0185302 A1 | 6/2020 | Lu et al. | |
| 2020/0185359 A1 | 6/2020 | Nakashima et al. | |
| 2022/0059426 A1 | 2/2022 | Kappauf et al. | |

FOREIGN PATENT DOCUMENTS

| | | | |
|---|---|---|---|
| DE | 102010022562 A1 | 12/2011 | |
| DE | 102008007310 B4 | 1/2016 | |
| DE | 112018004893 T5 | 6/2020 | |
| EP | 0901166 A1 | 3/1999 | |
| EP | 2271196 A1 | 1/2011 | |
| EP | 2528091 B1 | 3/2017 | |
| EP | 3273471 A1 | 1/2018 | |
| EP | 3624184 A1 | 3/2020 | |
| JP | 2003258176 A | 9/2003 | |
| JP | 2007012722 A | 1/2007 | |
| JP | 2007102803 A | 4/2007 | |
| JP | 2013197178 A | 9/2013 | |
| WO | WO 2007065666 A2 | 6/2007 | |
| WO | WO 2011024377 A1 | 3/2011 | |
| WO | WO 2013021870 A1 | 2/2013 | |
| WO | WO 2015019890 A1 | 2/2015 | |

* cited by examiner

66 Power Converter

2 Power Module

POWER MODULE HAVING AT LEAST THREE POWER UNITS

CROSS-REFERENCES TO RELATED APPLICATIONS

This application is the U.S. National Stage of International Application No. PCT/EP2021/061669, filed May 4, 2021, which designated the United States and has been published as International Publication No. WO 2022/002464 A1 and which claims the priority of European Patent Application, Ser. No. 20/183,215.1, filed Jun. 30, 2020, pursuant to 35 U.S.C. 119(a)-(d).

BACKGROUND OF THE INVENTION

The invention relates to a power module having at least two power units.

The invention additionally relates to a power converter having at least one power semiconductor module of this type.

In power converters of this type, switch modules that are closed, in particular by a housing, and that at present are manufactured in discrete structural forms, are generally screwed to a heat sink, for example by way of a solid metal baseplate. A power converter should for example be understood as a rectifier, an inverter, a converter or a DC-DC converter.

The published unexamined patent application DE 10 2009 001 722 A1 describes a power semiconductor module, the baseplate of which is embodied as a multilayer substrate and is provided with a cured heat transfer compound, and which is brought into thermal contact with a heat sink.

The published unexamined patent application DE 10 2010 022 662 A1 describes an electrical power module for mounting on a printed circuit board, comprising a first side for mounting on a surface of a heat sink, wherein in a mounted position of the electrical power module the first side is arranged on the heat sink substantially parallel to the heat sink, and a second side provided with electrical connection elements, wherein the electrical connection elements are adapted to electrically connect the electrical power module to the printed circuit board. The electrical power module can more easily be connected to the printed circuit board and the heat sink if the electrical power module comprises at least one plug-like fastening element or is adapted to accept at least one plug-like fastening element that can be inserted into at least one drill hole of the heat sink and is adapted to accept a clamping element such that by its insertion into the at least one plug-like fastening element the clamping element is clamped in the at least one drill hole of the heat sink.

The published unexamined patent application EP 3 624 184 A1 describes a method for producing a power module unit, wherein a baseplate is provided with recesses. The baseplate is connected to a substrate which carries the power semiconductor. After the substrate is fastened to the baseplate the cooling ribs are guided into the recesses of the baseplate and are fastened in a form-fit and/or force-fit manner.

The patent specification DE 10 2008 007 310 B4 describes an electrical press-in contact. In particular a press-in pin contact, for the transmission of electric current and/or electrical signals, having a press-in section and a mounting section which are mechanically coupled to each other via a relief section, and the relief section comprises a compensating portion and a stop portion, wherein the compensating portion allows a coupled relative movement of the press-in section and the mounting section, and the stop portion blocks a movement of press-in section and mounting section toward each other, and wherein the stop portion of the relief section is arranged symmetrically with respect to a force centerline of the electrical press-in contact, along which a press-in force can be introduced into the electrical press-in contact, said force resulting from the electrical press-in contact being pressed into a carrier.

Against this backdrop it is an object of the present invention to reduce the installation space required for power modules and to improve cooling.

SUMMARY OF THE INVENTION

The object is inventively achieved by a power module having at least two power units, which in each case comprise at least one power semiconductor and a substrate, wherein the at least one respective power semiconductor in each case is connected, in particular in a materially bonded manner, to the respective substrate, wherein the substrates of the at least three power units are in each case directly connected in a materially bonded manner to a surface of a common heat sink, wherein the heat sink is configured so that a gaseous coolant flows in a direction of coolant flow, wherein the direction of coolant flow runs substantially parallel to the surface of the heat sink, wherein the power units are arranged transversely offset to the direction of coolant flow, wherein the heat sink has cooling ribs arranged so as to run in a direction of coolant flow.

In addition the object is inventively achieved by a power converter having at least one power module of this type.

The advantages and preferred embodiments mentioned below in respect of the power module can be transferred analogously to the power converter.

The invention is based on the consideration of reducing the space required for a power module by reducing the number of thermal interfaces and thereby achieving improved cooling. A power module of this type has at least three power units, wherein the power units in each case comprise at least one power semiconductor and a substrate. A substrate is a dielectric material layer metallized on both sides, wherein the dielectric material layer for example has a thickness d of 25 $\mu$m to 400 $\mu$m, in particular 50 $\mu$m to 250 $\mu$m. The dielectric material layer further contains a ceramic material, for example aluminum nitride or aluminum oxide, or an organic material, for example a polyamides In particular the metallization contains copper, molybdenum, gold and/or silver. Furthermore, at least one side of the metallization of the substrate can be designed as structured. The power semiconductor is in particular embodied as a transistor and/or a diode, wherein the transistor is for example embodied as an insulated gate bipolar transistor (IGBT), as a metal oxide semiconductor field effect transistor (MOSFET) or as a field effect transistor. The at least one power semiconductor in each case is connected, in particular in a materially bonded manner, to the respective substrate, for example by way of a sinter connection or solder connection.

The substrates of the power units are in each case directly connected in a materially bonded manner to a surface of a common heat sink, in particular by a side facing away from the at least one power semiconductor. A direct materially bonded contact should be understood as a direct contact which includes connection means for producing the materially bonded connection such as adhesive, fin-solder, sinter compound, etc., but excludes an additional connection element such as an additional conductor, a bond wire, a spacer, a baseplate, heat transfer compound, etc. By omitting an additional connection element such as this an improved thermal coupling of the power semiconductors is achieved, so that improved cooling takes place. In addition, installation space is saved thanks to the direct materially bonded connection. Thanks to a materially bonded connection of at least three power units on a common heat sink a high degree of flexibility is achieved in respect of the positioning of the power units on the surface of the heat sink, in order thanks to heat splay to achieve optimized cooling and to make maximum use of the surface of the heat sink.

The heat sink is configured so that a gaseous coolant flows in a direction of coolant flow, wherein the direction of coolant flow runs substantially parallel to the surface of the heat sink. The gaseous coolant is for example air. In particular the power module is cooled on one side by a fan that is fluidically connected to the cooling ribs of the heat sink, so that the air flows from the fan substantially parallel to the surface of the heat sink via the cooling ribs of the heat sink. A configuration such as this is cost-effective and reliable.

The at least three power units are arranged transversely offset to the direction of coolant flow. Thanks to an offset arrangement a heat splay is achieved which results in optimum cooling.

A further form of embodiment provides that the substrates of the power units in each case have a dielectric material layer with a thermal conductivity of at least 25 W·m−1·K−1, in particular at least 100 W·m−1−K−1, and a thickness of 25 μm to 400 μm, in particular 50 μm to 250 μm. For example, the dielectric material layer is made of aluminum nitride or aluminum oxide. In particular thanks to the multiple substrates connected in a materially bonded matter on the surface of the heat sink it is possible to use thin ceramic layers of this type, resulting in an improvement in the thermal coupling of the power semiconductors.

A further form of embodiment provides that at least two of the power units have a common housing. A common housing of this type is for example made of a plastic material. Thanks to the common housing a saving in installation space is achieved.

A further form of embodiment provides that at least two of the power units are electrically conductively connected to one another, in particular via a bond connection. A bond connection of this type is for example produced using bond wires or ribbon bonds. For example, identical power units can be interconnected in parallel via the bond connection, in order to drive a higher load current. Thanks to a modular structure of this type, power modules can be produced in a cost-effective and scalable manner.

A further form of embodiment provides that the heat sink, which is made of a first metal material, has at least one cavity on its surface which is filled with a second metal material that has a higher thermal conductivity than the first metal material, wherein at least one substrate of a power unit is directly connected in a materially bonded manner to the second metal material. For example, the first metal material is aluminum and the second metal material is copper. By filling a cavity with the second metal material an improved thermal coupling of the power units to the heat sink is achieved.

A further form of embodiment provides that the second metal material terminates substantially flush with the surface of the heat sink. A termination configured as flush with the surface of the heat sink should be understood as a termination of the filling of the cavity that is flat and substantially continuous to the surface of the heat sink. In particular the second metal material forms a flat surface that transitions substantially seamlessly into the surface of the heat sink.

Thanks to a flat embodiment such as this an optimum thermal coupling to the heat sink is achieved and mechanical and/or thermal stresses in the substrate connected to the second metal material are prevented.

A further form of embodiment provides that each of the at least two power units is associated with a cavity filled with the second metal material. The cavities filled with the second metal material are for example embodied as islands that have a larger surface area than the respective substrates and at each of the edges of the substrate protrude over the substrate, as a result of which an improved thermal coupling of the power units to the heat sink is achieved.

A further form of embodiment provides that the second metal material is introduced into the at least one cavity using an additive method. For example, the second metal material is introduced into the at least one cavity by means of cold gas spraying. The additive method permits, in particular compared to a casting method, a very low thickness of the first metal material underneath the cavity, so that the cooling ribs are located very close to the second metal material, which has a higher thermal conductivity than the first metal material, so that an improved thermal coupling to a cooling fluid is achieved.

A further form of embodiment provides that the power units are arranged on the surface of the heat sink such that thanks to heat splay an optimum cooling of the power semiconductors takes place. The power units are oriented and spaced apart on the heat sink, in particular in relation to a direction of flow of a coolant, such that the waste heat arising in the power semiconductors of the power units, in particular approximately pointwise, is distributed as evenly as possible on the surface of the heat sink and thus a heat splay takes place. Thanks to an arrangement of this type a higher degree of robustness of the power module during operation is achieved.

A further form of embodiment provides that a spacing between the power units varies in the direction of coolant flow and/or transversely to the direction of coolant flow. For example, in each case a power unit is assigned to a phase of a three-phase system. By varying the spacings in the direction of coolant flow and/or transversely to the direction of coolant flow an optimum cooling is achieved thanks to heat splay.

A further form of embodiment provides that a spacing between the power units increases in the direction of coolant flow. Since the coolant heats up in the direction of coolant flow underneath the power units, a better mixture of strongly and weakly heated coolant is achieved as the distance increases. Furthermore, at least a higher degree of cooling is achieved as the spacing increases, so that in the direction of coolant flow increasing spacings result in a more even temperature distribution on the heat sink.

A further form of embodiment provides that a power board arranged to run substantially parallel to the surface of the heat sink is connected to the power units via freely positionable contacts, wherein the freely positionable contacts are connected in a materially bonded manner to the respective substrates of the power units. A power board should be understood as a circuit board that for example is embodied as a printed circuit board (PCB) embodied in particular in multiple layers. The circuit board for example contains an interface to the power units, a driver circuit, an actuation circuit, and/or capacitors. A freely positionable contact should for example be understood as a pin which thanks to its structural properties can be freely arranged on a substrate. Structural properties of this type are for example a foot that allows the pin, for example thanks to a materially bonded connection to the substrate, to be arranged freely and stably on the substrate without a housing or other stabilization means, and/or a wobble circle, which makes it easier to find a drill hole in the power board and ensures more stability and robustness, for example in the case of thermal expansion during operation. For example, the freely positionable contacts are soldered onto the respective substrates and are connected to the power board by means of a press-fit connection. A contact of this type is for example made of copper or a copper alloy, in order to achieve a low resistance and a high current-carrying capacity. Because the contacts can be freely positioned, short conduction paths and associated low inductances are achieved, thereby enabling power units with low impedances and small losses. Furthermore, it is possible to design individual cells of the power units in a cost-effective and simple manner.

A further form of embodiment provides that the freely positionable contacts are embodied asymmetrically in respect of a force centerline. A press-in force can be introduced into the freely positionable contact along the force centerline. An asymmetrical configuration of the freely positionable contacts enables a higher conductor cross-section to be implemented simultaneously with lower tool costs compared to the prior art, as a result of which the current-carrying capacity of the contacts is increased.

A further form of embodiment provides that the heat sink is made of an aluminum alloy with a silicon content of up to 1.0%, in particular up to 0.6%, by extrusion pressing. In particular in comparison to a cast heat sink, an improved thermal conductivity is achieved thanks to an extrusion-pressed heat sink, since in extrusion pressing it is possible to use a lower silicon content. An extrusion-pressed heat sink that is made of an aluminum alloy of this type results in an improved heat splay.

A further form of embodiment provides that the cooling ribs are arranged such that a ratio of a length of the cooling ribs to a spacing between the cooling ribs is at least 10. A ratio such as this can be achieved for example by extrusion pressing, wherein, in particular with an extrusion-pressed heat sink, an optimum cooling is achieved. Furthermore, with a ratio such as this short cooling ribs are enabled, for example with a length of 20 mm to 30 mm, so that the power module can be processed with the heat sink in a soldering furnace, in particular automatically, which makes the production of the power module simpler and more cost-effective.

A further form of embodiment provides that the heat sink has a baseplate with a substantially constant first thickness of 3.5 mm to 5 mm, in particular 3.5 mm to 4 mm, wherein the baseplate and the cooling ribs of the heat sink are embodied in one piece. A thin baseplate of this type, which for example can be produced by extrusion pressing, results in improved cooling. Furthermore, thanks to a thin baseplate of this type an overall height of the power module is reduced, so that the power module can be processed with the heat sink in a soldering furnace, in particular automatically, which makes the production of the power module simpler and more cost-effective.

BRIEF DESCRIPTION OF THE DRAWING

The invention is described and explained in greater detail below using the exemplary embodiments represented in the figures, in which.

DETAILED DESCRIPTION OF PREFERRED EMBODIMENTS

Figure 1:
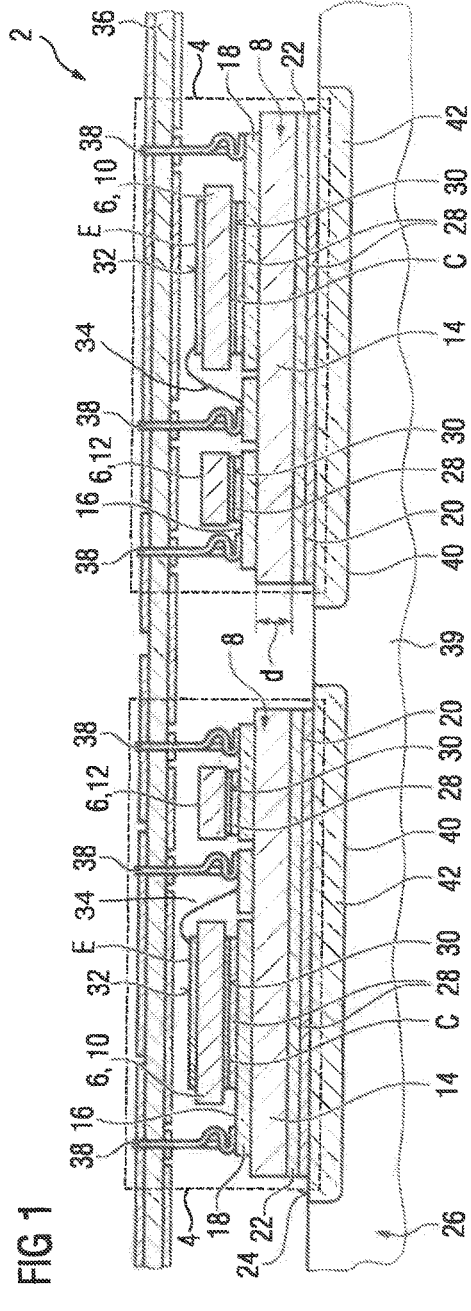
FIG. 1 shows a schematic representation of a first embodiment of a power module in cross-section.

The exemplary embodiments explained below are preferred forms of embodiment of the invention. In the exemplary embodiments the described components of the forms of embodiment in each case represent individual features of the invention, to be considered independently of one another, which also in each case develop the invention independently of one another and thus are also to be regarded as part of the invention individually or in a combination other than the one shown. Further, the described forms of embodiment can also be supplemented by further of the already described features of the invention.

The same reference characters have the same meaning in the different figures.

FIG. 1 shows a schematic representation of a first embodiment of a power module 2 in cross-section. By way of example, the power module 2 has two power units 4, which in each case comprise power semiconductors 6 and a substrate 8. The power semiconductors 6 are embodied as a transistor 10 or as a diode 12, wherein the transistor 10 is for example embodied as an insulated gate bipolar transistor (IGBT), as a metal oxide semiconductor field effect transistor (MOSFET) or as a field effect transistor. For example, each of the transistors 10 is assigned a diode 12, in particular an antiparallel diode 12.

The substrates 8 of both the power units 4 have a dielectric material layer 14 which contains a ceramic material, for example aluminum nitride or aluminum oxide, or an organic material, for example a polyimide. The dielectric material layer 14 has a thickness d of 25 μm to 400 μm, in particular 50 μm to 250 μm. In addition in each case the substrates 8 have an, in particular structured, upper metallization 18 on a side 16 facing the power semiconductors 6 and a lower metallization 22 on a side 20 facing away from the power semiconductors 6, wherein the substrates 8 in each case are directly connected in a materially bonded manner to a surface 24 of a common heat sink 26. The upper metallization 18 and the lower metallization 22 are for example made of copper. The materially bonded connection 28 to the heat sink 26 is produced by soldering or sintering. A directly materially bonded contact should be understood as a direct contact that includes connection means for producing the materially bonded connection such as adhesives, tin-solder, sinter compound, etc., but excludes an additional connection element such as an additional conductor, a bond wire, a spacer, a baseplate, heat transfer compound, etc. A side 30 of the power semiconductor 6 facing the substrate 8 is in each case likewise connected to the upper metallization 18 of the substrate 8 by way of a materially bonded connection 28 that is produced by soldering or sintering. A side 32 of the power semiconductors 6 facing away from the substrate 8 is in each case connected to the upper metallization 18 of the substrate 8 by way of a bond connection 34. The bond connection 34 for example comprises at least one bond wire, at least one ribbon bond and/or other means for producing a bond connection.

The transistors 10 in FIG. 1 are by way of example embodied as IGBTs, the collector contacts C of which are in each case connected to the upper metallization 18 of the substrate 8 by way of a materially bonded connection 28 on the side 30 of the power semiconductors 6 facing the substrate 8. The emitter contacts E of the transistors 10 embodied as IGBTs are, electrically insulated therefrom, connected to the upper metallization 18 of the substrate 8 by way of bond connections 34. The gate contacts of the transistors 10 and the bond connections of the diodes 12 are not represented in FIG. 1 for reasons of clarity.

A power board 36 arranged so as to run substantially parallel to the surface 24 of the heat sink 26 is connected to the power units 4 by way of freely positionable contacts 38, wherein the freely positionable contacts 38 are connected in a materially bonded manner to the upper metallizations 18 of the respective substrates 8 of the power units 4. The freely positionable contacts 38 have an elastically flexible section and are for example connected to the power board 36 by a press-fit connection.

The heat sink 26 is made of a first metal material 39. Cavities 40 are introduced on its surface 24 that are filled with a second metal material 42, wherein the second metal material 42 has a higher thermal conductivity than the first metal material 39. For example, the first metal material 39 is aluminum and the second metal material 42 is copper. Each of the at least two power units 4 is associated with a cavity 40 filled with the second metal material 42, wherein the second metal material 42 terminates substantially flush with the surface 24 of the heat sink 26 and the lower metallizations 22 of the respective substrate 8 are connected in a materially bonded manner to the second metal material 42. In particular, the second metal material 42 is Introduced into the cavities using an additive method, for example by means of cold gas spraying. Each of the power units 4 can be associated with a dedicated sensor, in particular a temperature sensor, in order to monitor the temperature of the power semiconductors 6.

Figure 2:
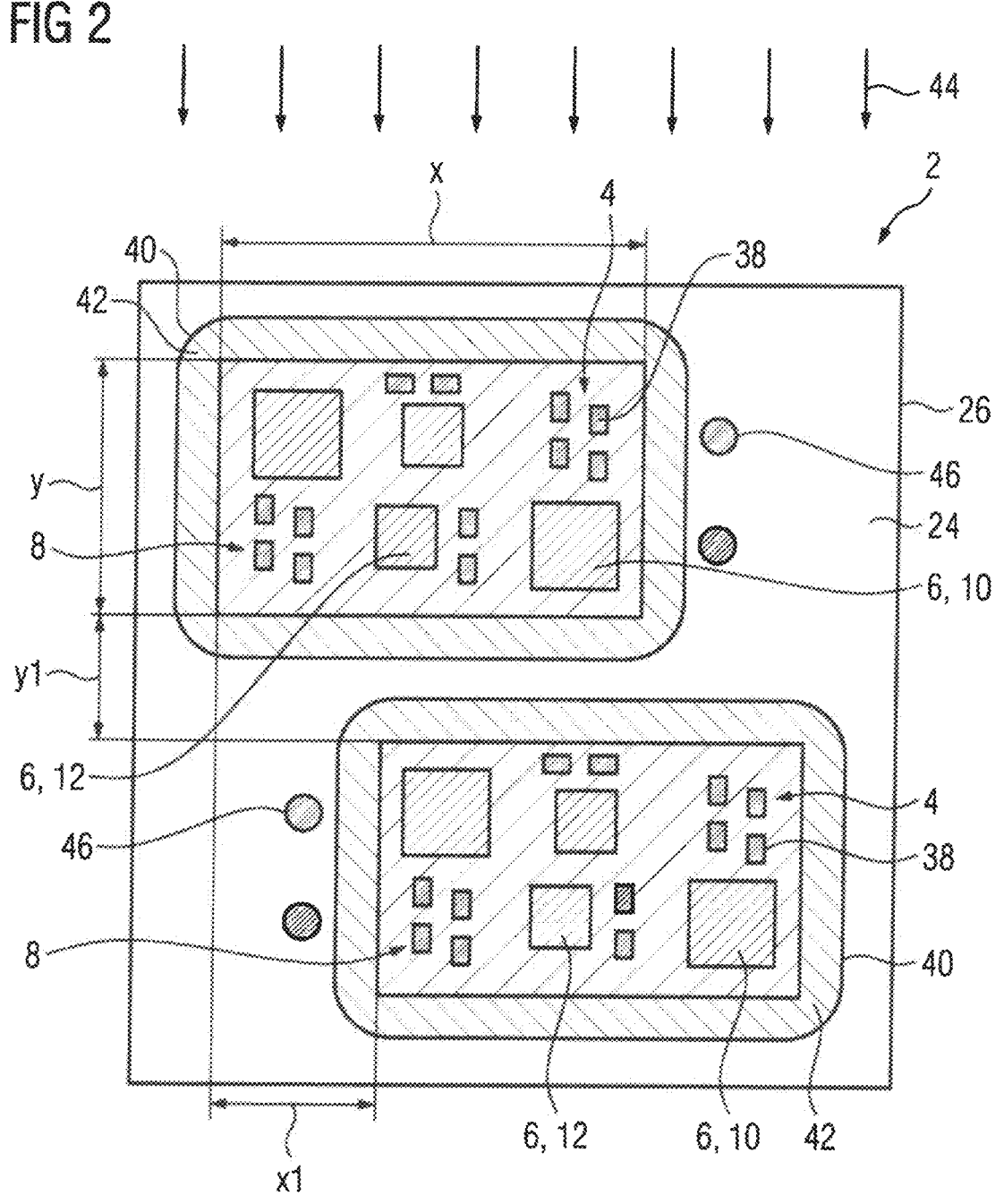
FIG. 2 shows a schematic representation of a second embodiment of a power module in a plan view.

FIG. 2 shows a schematic representation of a second embodiment of a power module 2 in a plan view. The heat sink 26 is configured, for example by cooling ribs, so that a gaseous coolant flows in a direction of coolant flow 44, wherein the direction of coolant flow 44 runs substantially parallel to the surface 24 of the heat sink 26. The gaseous coolant is for example air, which flows via a fan in the direction of coolant flow 44 over the cooling ribs of the heat sink 26. By way of example, the power module 2 has two power units 4, which are spaced apart on the surface 24 of the heat sink 26 such that thanks to heat splay an optimum cooling of the power semiconductors 6 takes place. Furthermore, the power units 4 have a rectangular base area with identical dimensions x, y. To achieve an optimum cooling of the power semiconductors 6 the power units 4, viewed transversely to the direction of coolant flow 44, are arranged offset by a first transverse offset x1. In addition, the power units 4, viewed in the direction of coolant flow 44, are spaced apart by a longitudinal offset y1 Because of the size of the surface 24 of the heat sink 26 the transverse offset x1 and the longitudinal offset y1 are smaller than the respective dimensions x, y of the power unit 4. Because the power units 4 are connected to the heat sink 26 in a materially bonded manner, fewer mounting points 46 are required. By way of example, each power unit 4 is associated with two mounting points 46, wherein the heat sink 26 has at least two mounting points 46, in particular at least four mounting points 46. The further embodiment of the power module 2 in FIG. 2 corresponds to the embodiment in FIG. 1.

Figure 3:
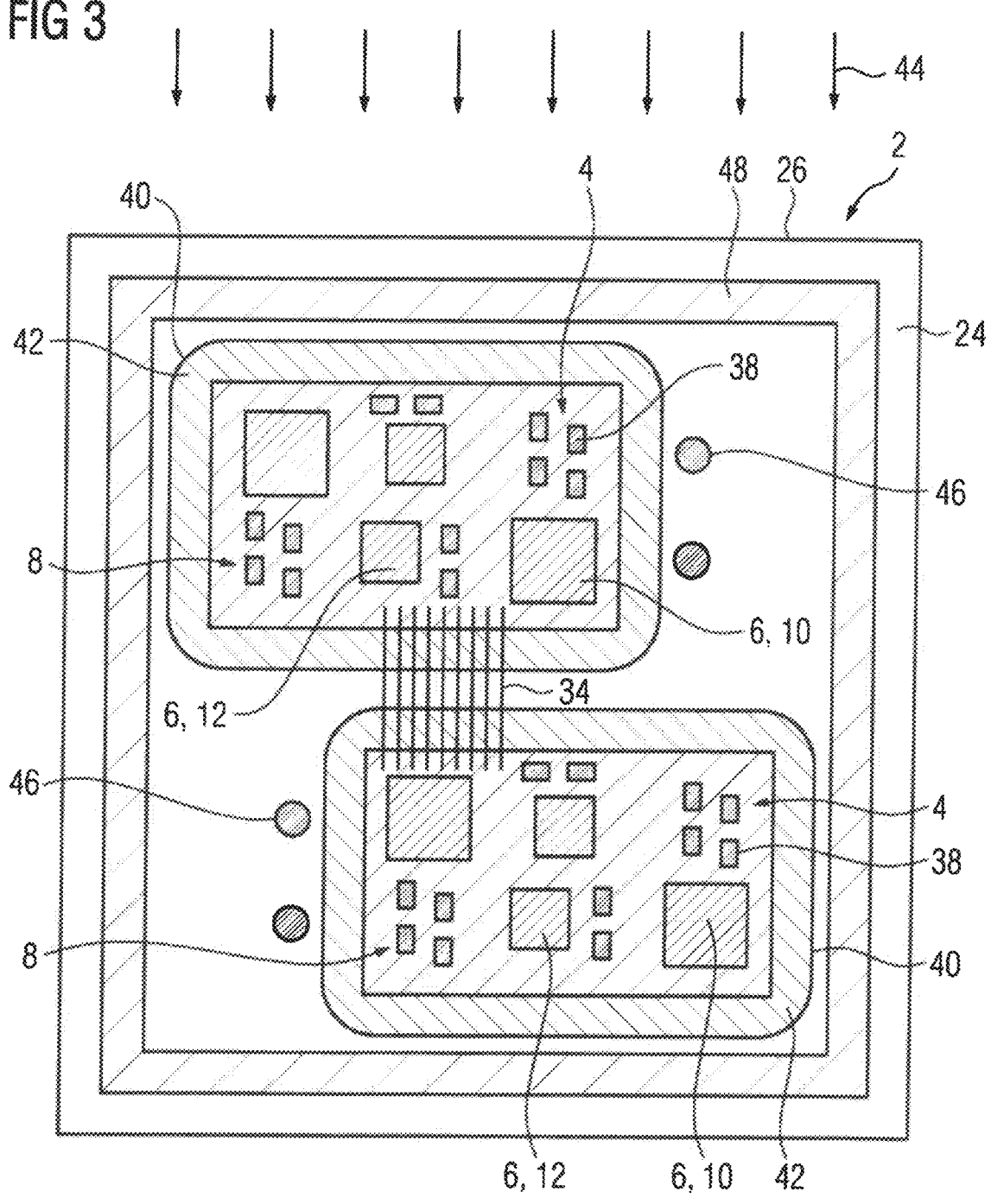
FIG. 3 shows a schematic representation of a third embodiment of a power module in a plan view.

FIG. 3 shows a schematic representation of a third embodiment of a power module 2 in a plan view, wherein the two power units 4 have a common housing 48. Both the power units 4 of the power module 2 are electrically conductively connected to one another by way of a bond connection 34, wherein the bond connection 34 has a plurality of bond wires, ribbon bonds and/or other means for producing the bond connection 34. For example, the housing 48 comprise a half-bridge circuit for high-current applications, wherein two half-bridges, which are each associated with a power unit 4, are connected in parallel, in order to drive a higher load current. The further embodiment of the power module 2 in FIG. 3 corresponds to the embodiment in FIG. 2.

Figure 4:
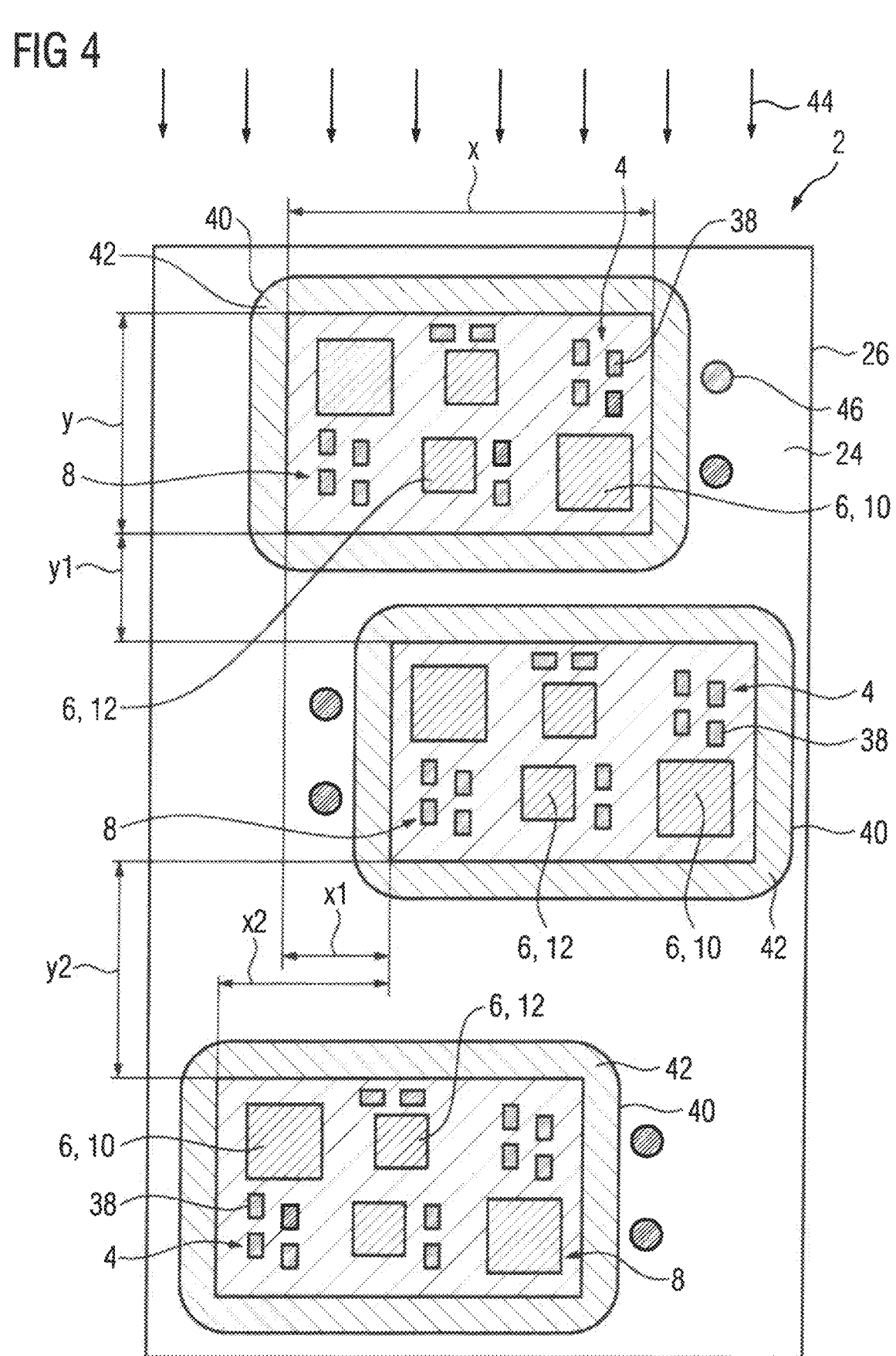
FIG. 4 shows a schematic representation of a fourth embodiment of a power module in a plan view.

FIG. 4 shows a schematic representation of a fourth embodiment of a power module 2 in a plan view, wherein the power module 2 comprises three power units 4. A spacing x1, x2, y1, y2 between the power units 4 varies in the direction of coolant flow 44 and transversely to the direction of coolant flow 44. In order to ensure a substantially even cooling of the power units 4, these are arranged such that the spacing y1, y2 between the power units 4 increases in the direction of coolant flow 44. The further embodiment of the power module 2 in FIG. 3 corresponds to the embodiment in FIG. 2.

Figure 5:
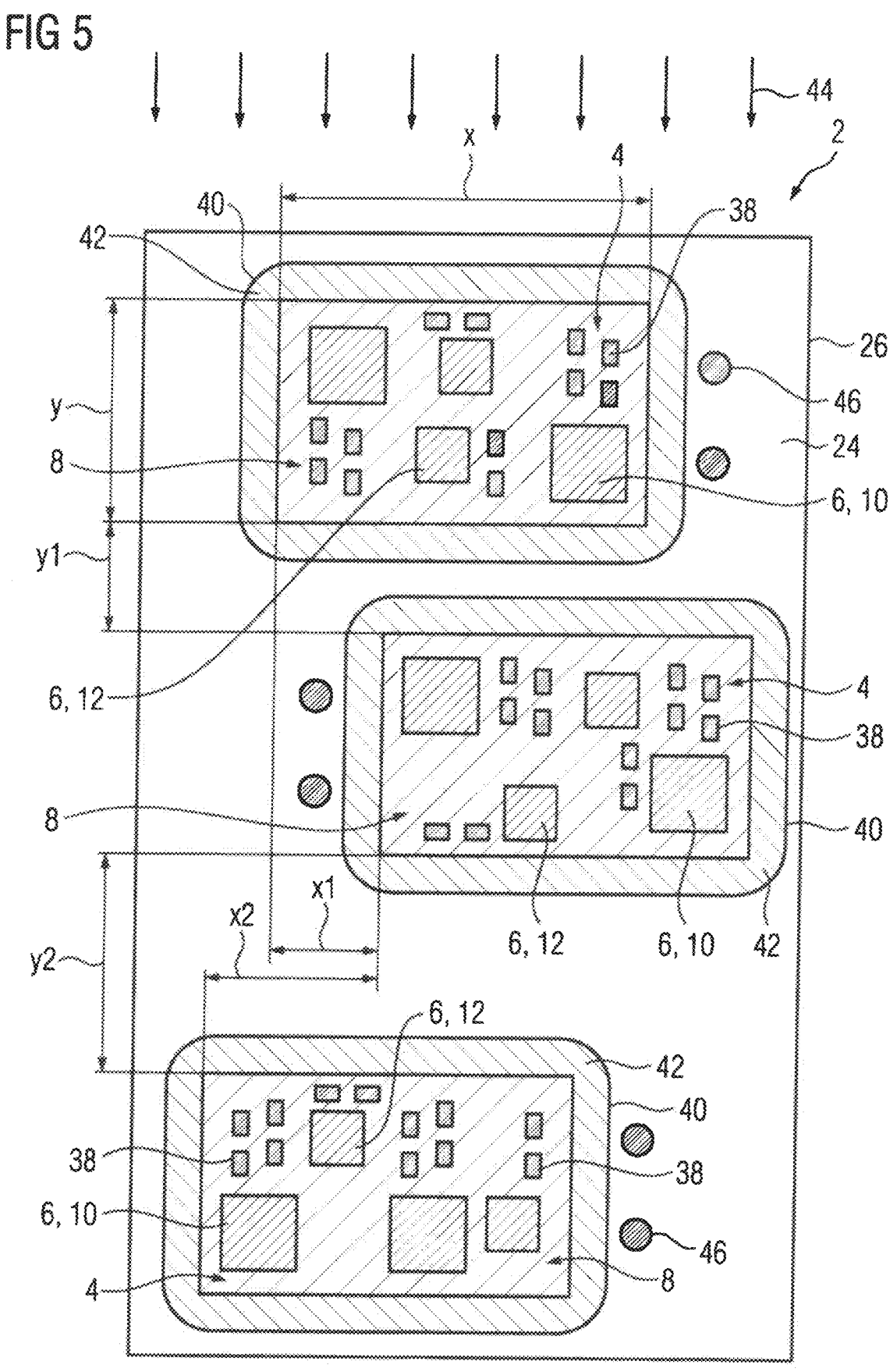
FIG. 5 shows a schematic representation of a fifth embodiment of a power module in a plan view.

FIG. 5 shows a schematic representation of a fifth embodiment of a power module 2 in a plan view, wherein besides the variation in the spacings x1, x2, y1, y2 between the power units 4 an additional heat splay is achieved thanks to a different arrangement of the components on the substrates 8. In particular, the power semiconductors 6 having the freely positionable contacts 38 are arranged on the respective substrates such that an optimum cooling of the power semiconductors 4 takes place. The surface area of the respective substrates 8 can be varied for a larger heat splay. The further embodiment of the power module 2 in FIG. 5 corresponds to the embodiment in FIG. 4.

Figure 6:
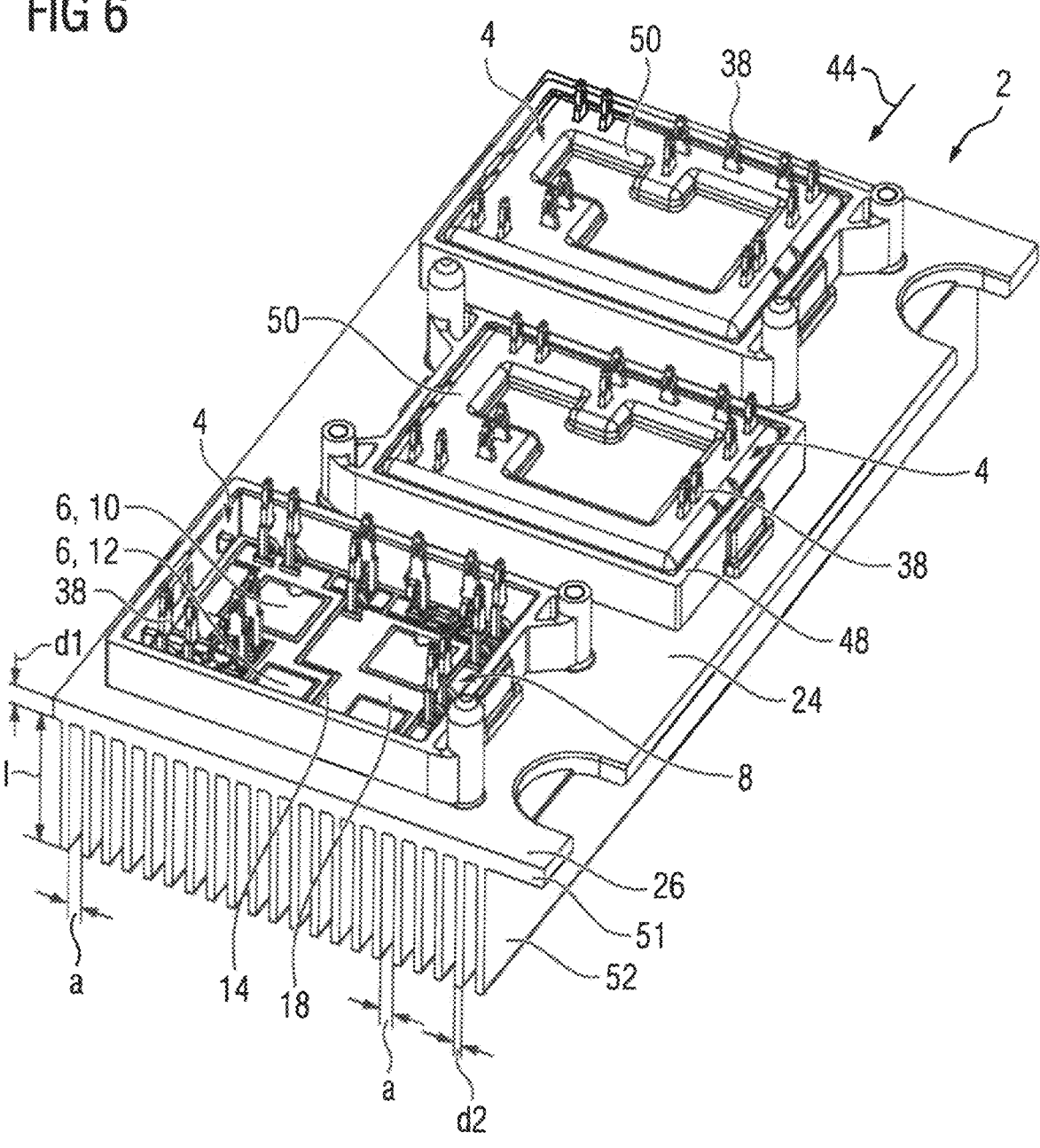
FIG. 6 shows a schematic three-dimensional representation of a sixth embodiment of a power module.

FIG. 6 shows a schematic three-dimensional representation of a sixth embodiment of a power module 2, wherein the power module 2 comprises three power units 4. The power units 4 in each case have a housing 48 having a housing cover 50, wherein the housing cover 50 is represented as transparent in the case of the foremost power unit 4. The heat sink has a baseplate 51 having cooling ribs 52 running in the direction of coolant flow 44, wherein the cooling ribs 52 are connected to the baseplate 51 and wherein the baseplate 51 and the cooling ribs 52 of the heat sink 26 are embodied in one piece. The baseplate 51 has a substantially constant first thickness d1 of 3.5 mm to 5 mm, in particular 3.5 mm to 4 mm, whereas the ribs have a second thickness d2 that is smaller than the first thickness d1 of the baseplate 51. By way of example, the cooling ribs 52 are arranged equidistantly transversely to the direction of coolant flow 44.

The heat sink 26 is produced by extrusion pressing from an aluminum alloy, which for example has a silicon content of 0.1% to 1.0% in particular of 0.1% to 0.6%. Furthermore, the cooling ribs 52 are arranged such that a ratio of a length l of the cooling ribs 52 to a spacing a between the cooling ribs 52 is at least 10: $l/a \geq 10$. The further embodiment of the power module 2 in FIG. 6 corresponds to the embodiment in FIG. 4.

Figures 7, 8:
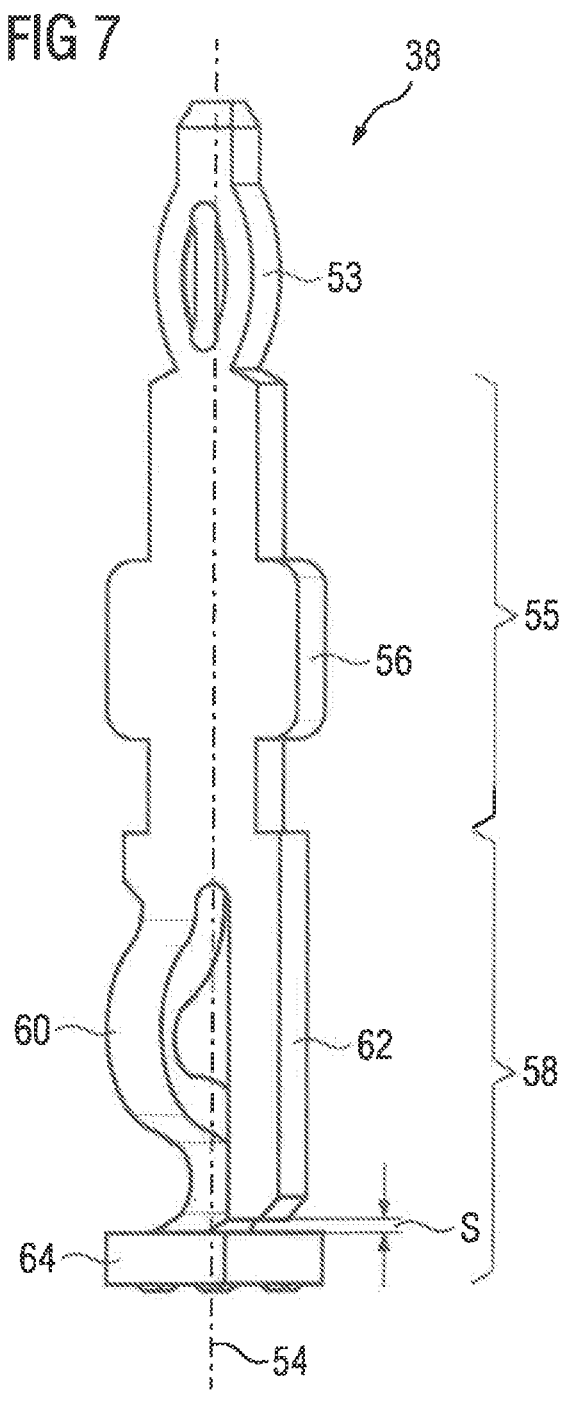
FIG. 7 shows a three-dimensional representation of a freely positionable contact.
FIG. 8 shows a schematic representation of a power converter having a power module.

FIG. 7 shows a three-dimensional representation of a freely positionable contact 38. The freely positionable contact 38 has a press-in zone 53 that can be connected to the power board 36 and is embodied asymmetrically in respect of a force centerline 54, wherein a press-in force can be introduced into the freely positionable contact 38 along the force centerline 54. Positioning aids 56 are attached in a central part 55 for the alignment of the freely positionable contact 38, for example in a solder jig. A lower part 58 of the freely positionable contact 38 is embodied as an asymmetrical relief section, which has an elastically flexible section 60 and a stop 62 arranged parallel thereto, wherein the stop is spaced apart from a foot 64 by way of a gap width s. The foot 64 is configured for a materially bonded connection, for example by soldering or sintering. In particular the freely positionable contact 38 is connected to the upper metallization 18 of a substrate 8 in a materially bonded manner by way of the foot 64. The elastically flexible section 60 has an S-shaped spring form with a defined spring path. It is therefore possible to absorb forces that are for example caused by jolting and occur in the relief section during the press-in process or during operation. In addition, thanks to the elasticity, tolerances can be compensated. In particular, a spring constant of the elastically flexible section 60 is produced by stamping with the help of a reduction in the cross-section. The further embodiment of the freely positionable contact 38 in FIG. 7 corresponds to the embodiment in FIG. 1.

FIG. 8 shows a schematic representation of a power converter 66 having a power module 2. The power converter 66 can comprise more than one power module 2.

In summary, the invention relates to a power module 2 having at least two power units 4, which in each case comprise at least one power semiconductor 6 and a substrate 8. In order to reduce the installation space required for the power module and to improve cooling it is proposed that the respective at least one power semiconductor 6 is connected, in particular in a materially bonded manner, to the respective substrate 8, wherein the substrates 8 of the at least two power units 4 are in each case directly connected in a materially bonded manner to a surface 24 of a common heat sink 26.

The invention claimed is:

1. A power module, comprising:

a heat sink configured to enable a gaseous coolant to flow in a direction of coolant flow substantially parallel to a surface of the heat sink, said heat sink comprising cooling ribs extending in the direction of coolant flow;

at least three power units, each of the at least three power units comprising a substrate and a power semiconductor connected to the substrate, in particular in a materially bonded manner, with the substrates of the at least three power units being directly connected in a materially bonded manner to the surface of the common heat sink, said at least three power units arranged offset transversely to the direction of coolant flow;

a power board arranged to run substantially parallel to the surface of the heat sink; and freely positionable contacts configured to connect the power board to the at least three power units.

2. The power module of claim 1, wherein the substrates of the power units include each a dielectric material layer with a thermal conductivity of at least 25 W·m−1·K−1, in particular at least 100 W·m−1·K−1, and a thickness d of 25 µm to 400 µm, in particular 50 µm to 250 µm.

3. The power module of claim 1, wherein the substrates include each a dielectric material layer with a thickness of 25 µm to 400 µm, in particular 50 µm to 250 µm.

4. The power module of claim 1, further comprising a common housing configured to accommodate at least two of the at least three power units.

5. The power module of claim 1, wherein at least two of the at least three power units are electrically conductively connected to one another, in particular by way of a bond connection.

6. The power module of claim 1, wherein the heat sink is made of a first metal material, with the surface having a cavity which is filled with a second metal material of a thermal conductivity which is higher than a thermal conductivity of the first metal material, said substrate being directly connected in a materially bonded manner to the second metal material.

7. The power module of claim 6, wherein the second metal material terminates substantially flush with the surface of the heat sink.

8. The power module of claim 6, wherein the surface of the heat sink includes three of said cavity filled with the second metal material, with the at least three power units being associated with the cavities in one-to-one correspondence.

9. The power module of claim 6, wherein the second metal material is introduced into the cavity using an additive method.

10. The power module of claim 1, wherein a spacing between the at least three power units varies in the direction of the coolant flow and/or transversely to the direction of the coolant flow.

11. The power module of claim 1, wherein a spacing between the at least three power units increases in the direction of the coolant flow.

12. The power module of claim 1, wherein the freely positionable contacts are connected to the substrates of the at least three power units in a materially bonded manner.

13. The power module of claim 1, wherein the freely positionable contacts are embodied asymmetrically in relation to a force centerline.

14. The power module of claim 1, wherein the freely positionable contacts have a wobble circle.

15. The power module of claim 1, wherein the freely positionable contacts have an elastically flexible section having an S-shaped spring form with a defined spring path, a foot, and a stop arranged parallel to the flexible section and spaced apart from the foot by a gap width, said foot configured for a materially bonded connection.

16. The power module of claim 1, wherein the heat sink is made of an aluminum alloy with a silicon content of up to 1.0%, in particular up to 0.6%, by extrusion pressing.

17. The power module claim 1, wherein the cooling ribs are arranged such that a ratio of a length of the cooling ribs to a spacing between the cooling ribs is at least 10.

18. The power module of claim 1, wherein the heat sink includes a baseplate with a substantially constant first thickness d1 of 3.5 mm to 5 mm, in particular 3.5 mm to 4 mm, with the baseplate and the cooling ribs of the heat sink being embodied in one piece.

19. A power converter, comprising a power module, said power module comprising a heat sink configured to enable a gaseous coolant to flow in a direction of coolant flow substantially parallel to a surface of the heat sink, said heat sink comprising cooling ribs extending in the direction of coolant flow, at least three power units, each of the at least three power units comprising a substrate and a power semiconductor connected to the substrate, in particular in a materially bonded manner, with the substrates of the at least three power units being directly connected in a materially bonded manner to the surface of the common heat sink, said at least three power units arranged offset transversely to the direction of coolant flow, a power board arranged to run substantially parallel to the surface of the heat sink, and freely positionable contacts configured to connect the power board to the at least three power units.

* * * * *